United States Patent
Norimoto

(10) Patent No.: US 10,629,487 B2
(45) Date of Patent: Apr. 21, 2020

(54) WAFER DIVIDING METHOD

(71) Applicant: DISCO CORPORATION, Tokyo (JP)

(72) Inventor: Ryuji Norimoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/790,252

(22) Filed: Oct. 23, 2017

(65) Prior Publication Data

US 2018/0114696 A1 Apr. 26, 2018

(30) Foreign Application Priority Data

Oct. 24, 2016 (JP) .................................. 2016-207846

(51) Int. Cl.

| H01L 21/78 | (2006.01) |
|---|---|
| H01L 21/308 | (2006.01) |
| H01L 21/268 | (2006.01) |
| H01L 21/67 | (2006.01) |
| H01L 21/304 | (2006.01) |
| H01L 21/3065 | (2006.01) |
| H01L 21/683 | (2006.01) |

(52) U.S. Cl.
CPC ............ *H01L 21/78* (2013.01); *H01L 21/268* (2013.01); *H01L 21/304* (2013.01); *H01L 21/3065* (2013.01); *H01L 21/3081* (2013.01); *H01L 21/3086* (2013.01); *H01L 21/67092* (2013.01); *H01L 21/6836* (2013.01); *H01L 2221/68327* (2013.01)

(58) Field of Classification Search
None
See application file for complete search history.

(56) References Cited

U.S. PATENT DOCUMENTS

| 6,703,075 B1 * | 3/2004 | Lin ...................... H01L 21/6836 |
| | | 427/256 |
| 2005/0106782 A1 * | 5/2005 | Genda ..................... B23K 26/18 |
| | | 438/118 |
| 2016/0104626 A1 * | 4/2016 | Nelson ................. H01L 23/3114 |
| | | 438/114 |
| 2016/0307851 A1 * | 10/2016 | Ohura ...................... H01L 21/78 |

FOREIGN PATENT DOCUMENTS

JP          2001-127011          5/2011

* cited by examiner

*Primary Examiner* — Jiong-Ping Lu
(74) *Attorney, Agent, or Firm* — Greer Burns & Crain, Ltd.

(57) ABSTRACT

Disclosed herein is a wafer dividing method including a shield film forming step of applying a liquid resin to the back side of a wafer having a plurality of devices on the front side, thereby forming a shield film from the liquid resin, the liquid resin containing a laser absorbing agent for absorbing a laser beam, a shield film removing step of applying the laser beam along each division line to the shield film formed on the back side of the wafer, thereby performing ablation to remove the shield film along each division line, and a dividing step of plasma-etching the wafer from the back side thereof after performing the shield film removing step, thereby partially removing the wafer in an area corresponding to each division line to thereby divide the wafer into a plurality of device chips.

3 Claims, 8 Drawing Sheets

WAFER DIVIDING METHOD

BACKGROUND OF THE INVENTION

Field of the Invention

The present invention relates to a wafer dividing method for dividing a wafer into device chips.

Description of the Related Art

As a method of dividing a semiconductor wafer into individual device chips, a dividing method using a cutting blade or a laser beam is conventionally known. In such a dividing method, a plurality of division lines formed on the wafer are processed one by one. Accordingly, when the wafer is enlarged in size (diameter) and the number of the division lines is increased, there arises a problem such that the time required for processing of the wafer may be increased.

To cope with this problem, there has been developed a dividing method in which all the division lines formed on the wafer are processed collectively at a time by plasma etching to thereby reduce the processing time (see Japanese Patent Laid-Open No. 2001-127011, for example). This dividing method has the above effect that the processing time can be reduced and also has another effect that the die strength of each device chip can be increased because no mechanical processing is performed to a groove formed on the wafer.

SUMMARY OF THE INVENTION

However, the wafer dividing method described in Japanese Patent Laid-Open No. 2001-127011 has a problem of how to form a mask for protecting the devices from a plasma produced in plasma etching, efficiently at low cost.

It is therefore an object of the present invention to provide a wafer dividing method which can form the mask for protecting the devices from the plasma efficiently at low cost.

In accordance with an aspect of the present invention, there is provided a wafer dividing method for dividing a wafer having a plurality of devices on the front side, the devices being formed in a plurality of separate regions defined by a plurality of crossing division lines, the wafer dividing method including a shield film forming step of applying a liquid resin or a sheet resin to the back side of the wafer, thereby forming a shield film from the liquid resin or the sheet resin, the liquid resin or the sheet resin containing a laser absorbing agent for absorbing a laser beam; a shield film removing step of applying the laser beam along each division line to the shield film formed on the back side of the wafer, thereby performing ablation to remove the shield film along each division line; and a dividing step of the wafer after performing the shield film removing step by plasma-etching the wafer from the back side thereof in an area corresponding to each division line to thereby divide the wafer into a plurality of individual device chips; the shield film being formed as a die bonding adhesive.

Preferably, the shield film forming step includes a coating step of applying the liquid resin to the back side of the wafer and a curing step of curing the liquid resin applied; the coating step and the curing step being repeated until a plurality of shield film layers formed from the liquid resin cured are stacked on the back side of the wafer, thereby forming the shield film including the plurality of shield film layers stacked.

Preferably, the laser absorbing agent is selected from the group consisting of a dye, coloring matter, and ultraviolet absorbing agent. Preferably, the laser absorbing agent is selected from the group consisting of a fine powder of oxide and a fine power of nitride.

According to the wafer dividing method of the present invention, the mask for protecting the devices from the plasma can be formed efficiently at low cost.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A preferred embodiment of the present invention will now be described in detail with reference to the drawings. The present invention is not limited to this preferred embodiment. Further, the components used in this preferred embodiment may include those that can be easily assumed by persons skilled in the art or substantially the same elements as those known in the art. Further, the configurations described below may be suitably combined. Further, the configurations may be variously omitted, replaced, or changed without departing from the scope of the present invention.

First Preferred Embodiment

Figure 1:
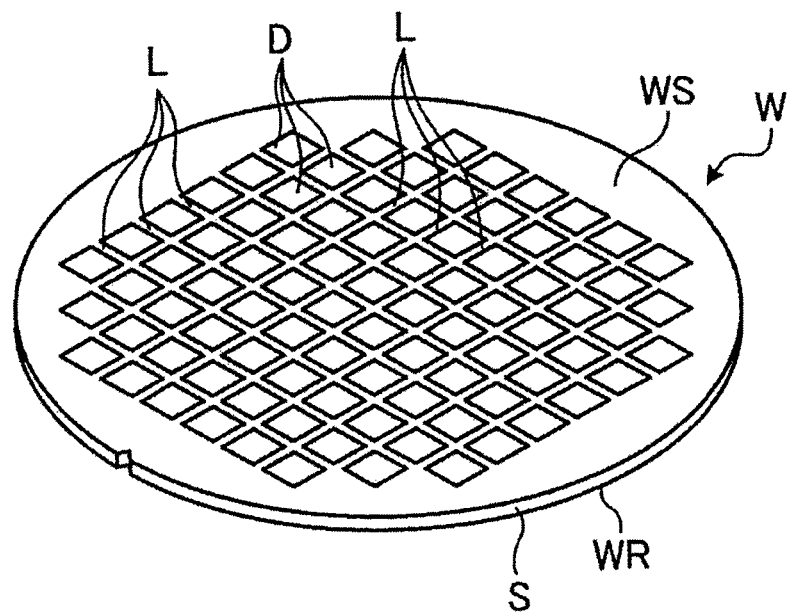
FIG. 1 is a perspective view depicting a wafer to be processed by a wafer dividing method according to a first preferred embodiment.
Figure 2:
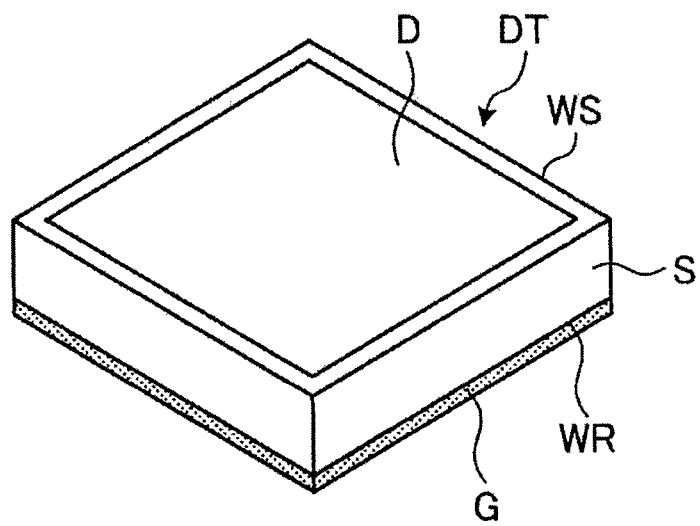
FIG. 2 is a perspective view depicting a device chip divided from the wafer by the wafer dividing method according to the first preferred embodiment.

A wafer dividing method according to a first preferred embodiment will now be described with reference to the drawings. FIG. 1 is a perspective view depicting a wafer W to be processed by the wafer dividing method according to the first preferred embodiment. FIG. 2 is a perspective view depicting a device chip DT divided from the wafer W by the wafer dividing method according to the first preferred embodiment.

The wafer dividing method according to the first preferred embodiment is a dividing method for processing the wafer W depicted in FIG. 1. The wafer W depicted in FIG. 1 is a disk-shaped semiconductor wafer or optical device wafer having a substrate S formed of silicon, sapphire, or gallium arsenide, for example. As depicted in FIG. 1, the substrate S of the wafer W has a front side WS and a back side WR. The front side WS of the substrate S (wafer W) is formed with a plurality of crossing division lines L (e.g., intersecting at right angles in the first preferred embodiment) to thereby define a plurality of separate regions where a plurality of devices D are formed. In the first preferred embodiment, the wafer W has an outer diameter of 300 mm, and each device D has a size of approximately 5 mm for each side, wherein the wafer W is preferably divided into the individual device chips DT by plasma etching, one of the device chips DT being depicted in FIG. 2. Each device chip DT includes a part of the substrate S, the device D formed on the front side WS of this part of the substrate S, and a die bonding adhesive G covering the back side WR of the substrate S (wafer W). In the first preferred embodiment, the die bonding adhesive G of each device chip DT functions to bond the device chip DT to a mother substrate or another chip, and has plasma resistance.

Figure 3:
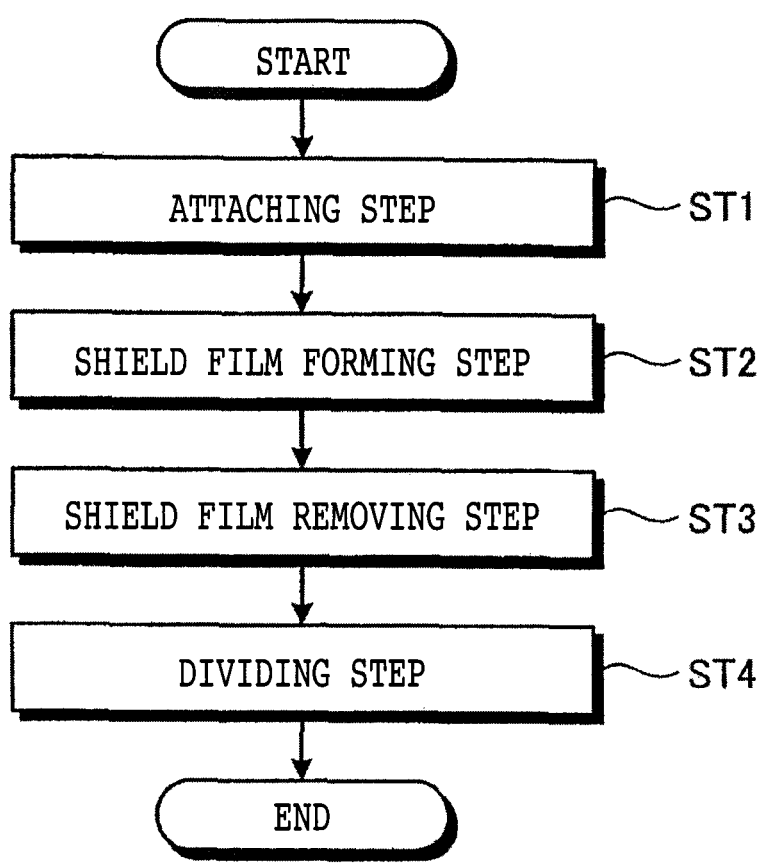
FIG. 3 is a flowchart depicting the flow of the wafer dividing method according to the first preferred embodiment.

The wafer dividing method according to this preferred embodiment will now be described with reference to the drawings. The wafer dividing method (which will be hereinafter referred to simply as "dividing method") according to this preferred embodiment is a method for cutting the wafer W along the division lines L to divide (dice) the wafer W into the individual device chips DT (one of which being depicted in FIG. 2). That is, this method is also a manufacturing method for the device chips DT. As depicted in FIG. 3, the dividing method according to this preferred embodiment includes an attaching step ST1, shield film forming step ST2, shield film removing step ST3, and dividing step ST4.

Figure 4:
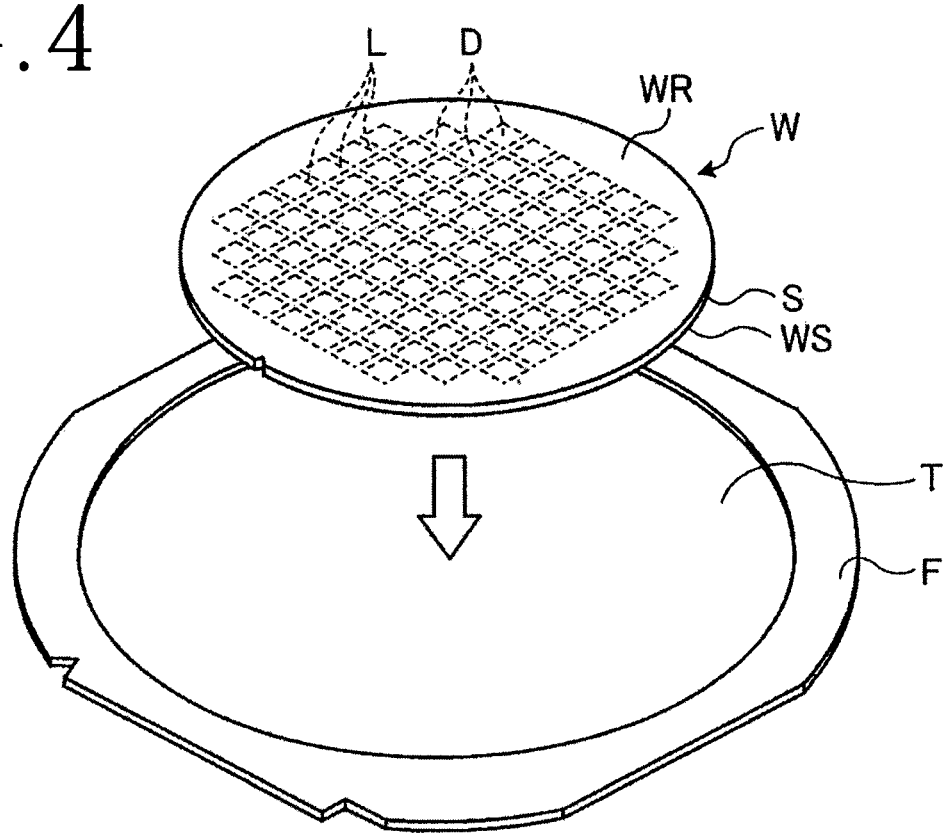
FIG. 4 is a perspective view depicting an attaching step depicted in FIG. 3.
Figure 5:
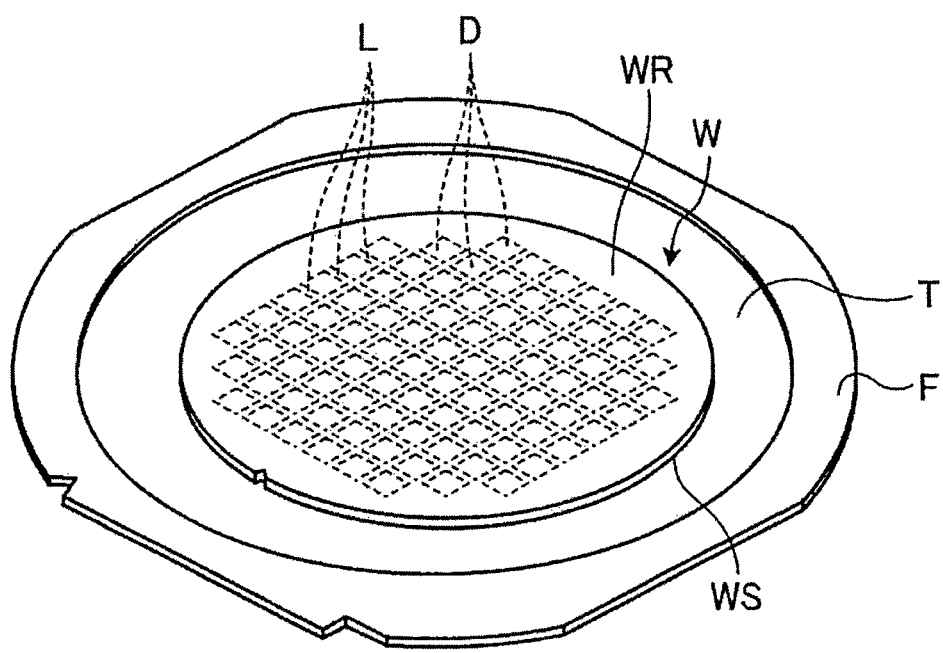
FIG. 5 is a perspective view of the wafer processed by the attaching step depicted in FIG. 4.

The attaching step ST1 is a step of attaching a dicing tape T (see FIG. 4) to the front side WS of the wafer W. FIGS. 4 and 5 depict the attaching step ST1 in the first preferred embodiment. As depicted in FIG. 4, an annular frame F is previously attached to a peripheral portion of the dicing tape T. First, the front side WS of the wafer W is opposed to the dicing tape T supported to the annular frame F. Thereafter, the front side WS of the wafer W is attached to the dicing tape T as depicted in FIG. 5.

Figure 6:
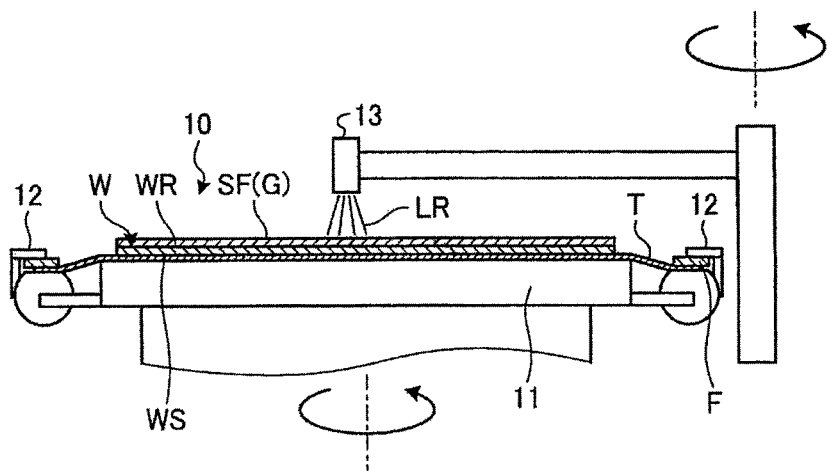
FIG. 6 is a partially sectional side view depicting a shield film forming step depicted in FIG. 3.
Figure 7:
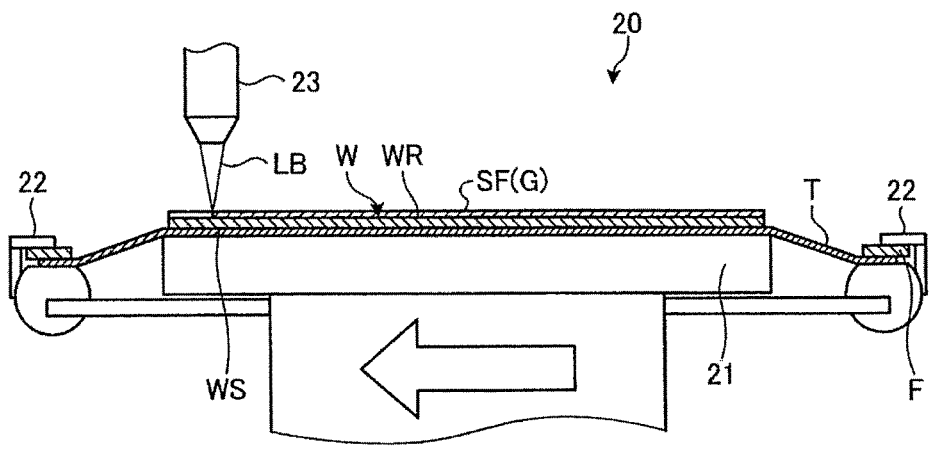
FIG. 7 is a partially sectional side view depicting a shield film removing step depicted in FIG. 3.

The shield film forming step ST2 is a step of applying a liquid resin LR (see FIG. 6) to the back side WR of the wafer W, thereby forming a shield film SF (see FIG. 6) from the liquid resin LR, the liquid resin LR containing a laser absorbing agent for absorbing a laser beam LB (see FIG. 7). FIG. 6 depicts the shield film forming step ST2 in the first preferred embodiment. As depicted in FIG. 6, the front side WS of the wafer W is held under suction through the dicing tape T on a chuck table 11 included in a coating apparatus 10. That is, the back side WR of the wafer W held through the dicing tape T on the chuck table 11 is exposed upward. Further, the annular frame F supporting the wafer W through the dicing tape T is fixed to the chuck table 11 by means of a plurality of clamps 12. In this condition, the chuck table 11 is rotated about its axis and the liquid resin LR is dropped from a nozzle 13 onto the back side WR of the wafer W at its center. As a result, the liquid resin LR is applied to the whole surface of the back side WR of the wafer W. The liquid resin LR thus applied is cured with the elapse of time.

For example, epoxy resin is used as the liquid resin LR. A laser absorbing agent for absorbing a laser beam having a wavelength of 355 nm may be used as the laser absorbing agent. This laser absorbing agent is previously mixed with the liquid resin LR. By curing the liquid resin LR applied to the back side WR of the wafer W, the shield film SF having plasma resistance is formed on the back side WR of the wafer W. The shield film SF functions also as the die bonding adhesive G.

The laser absorbing agent mixed with the liquid resin LR is selected from a dye, coloring matter, and ultraviolet absorbing agent. Examples of the dye include azo dye (monoazo and polyazo dyes, metal complex azo dye, pyrazolone azo dye, stilbene azo dye, and thiazole azo dye), anthraquinone dye (anthraquinone derivatives and anthrone derivatives), indigoid dye (indigoid derivatives and thioindigoid derivatives), phthalocyanine dye, carbonium dye (diphenyl methane dye, triphenyl methane dye, xanthene dye, and acridine dye), quinoneimine dye (azine dye, oxazine dye, and thiazine dye), methine dye (cyanine dye and azomethine dye), quinoline dye, nitroso dye, benzoquinone and naphthoquinone dyes, naphthalimide dye, and perinone dye. At least one of these dyes is selected.

As the coloring matter, a food color is used from the viewpoint of environmental load or the like. Examples of the food color include food red No. 2, food red No. 40, food red No. 102, food red No. 104, food red No. 105, food red No. 106, food yellow NY, food yellow No. 4 tartrazine, food yellow No. 5, food yellow No. 5 sunset yellow FCF, food orange AM, food vermilion No. 1, food vermilion No. 4, food vermilion No. 101, food blue No. 1, food blue No. 2, food green No. 3, food melon green B, and food egg-yolk yellow No. 3. At least one of these food colors is selected.

Examples of the ultraviolet absorbing agent include 4,4'-dicarboxy benzophenone, benzophenone-4-carboxylic acid, 2-carboxy anthraquinone, 1,2-naphthalene dicarboxylic acid, 1,8-naphthalene dicarboxylic acid, 2,3-naphthalene dicarboxylic acid, 2,6-naphthalene dicarboxylic acid, 2,7-naphthalene dicarboxylic acid, their sodium salts, their potassium salts, their ammonium salts, their quaternary ammonium salts, sodium salt of 2,6-anthraquinone disulfonic acid, sodium salt of 2,7-anthraquinone disulfonic acid, and ferulic acid. At least one of these compounds is selected. Of these compounds, ferulic acid is preferable.

The laser absorbing agent mixed with the liquid resin LR may be selected from a fine powder of oxide and a fine powder of nitride. Examples of the fine powder of oxide include $TiO_2$, $Fe_2O_3$, ZnO, $CeO_2$, CuO, $Cu_2O$, and MgO. At least one of these oxides is selected. Examples of the fine powder of nitride include AlN, ZrN, HfN, hexagonal BN, and TiN. At least one of these nitrides is selected. Thus, the laser absorbing agent mixed with the liquid resin LR includes at least one of the dye, coloring matter, ultraviolet absorbing agent, fine powder of oxide, and fine powder of nitride as described above. In the present invention, the laser absorbing agent is preferably used in an amount so that the gram absorption coefficient k of the shield film SF is in the range of $3 \times 10^{-3}$ to $2.5 \times 10^{-1}$ abs·L/g (abs: absorbance).

The shield film removing step ST3 is a step of applying the laser beam LB along each division line L to the shield film SF formed on the back side WR of the wafer W, thereby performing ablation to remove the shield film SF along each division line L. FIG. 7 depicts the shield film removing step ST3 in the first preferred embodiment. As depicted in FIG. 7, the front side WS of the wafer W is held under suction through the dicing tape T on a chuck table 21 included in a laser processing apparatus 20 for performing the ablation. That is, the shield film SF formed on the back side WR of the wafer W held through the dicing tape T on the chuck table 21 is exposed upward. Further, the annular frame F supporting the wafer W through the dicing tape T is fixed to the chuck table 21 by means of a plurality of clamps 22.

Thereafter, the front side WS of the wafer W is imaged by an infrared camera (not depicted) included in the laser processing apparatus 20 from the back side WR of the wafer W, thereby detecting the division lines L. After positioning a target one of the division lines L below laser beam applying means 23 included in the laser processing apparatus 20, the laser beam applying means 23 and the chuck table 21 are relatively moved along the target division line L, and at the same time the laser beam LB is applied from the laser beam applying means 23 to the shield film SF formed on the back side WR of the wafer W along the target division line L as depicted in FIG. 7. As a result, ablation is performed to the shield film SF along the target division line L. That is, the shield film SF is partially removed by ablation using the laser beam LB in an area corresponding to the target division line L. That is, the shield film SF is partially removed at a position superimposed on the target division line L as viewed in the thickness direction of the wafer W. As a result, the back side WR of the wafer W is exposed at this position corresponding to the target division line L. This step is similarly repeated for the other division lines L.

Figure 8:
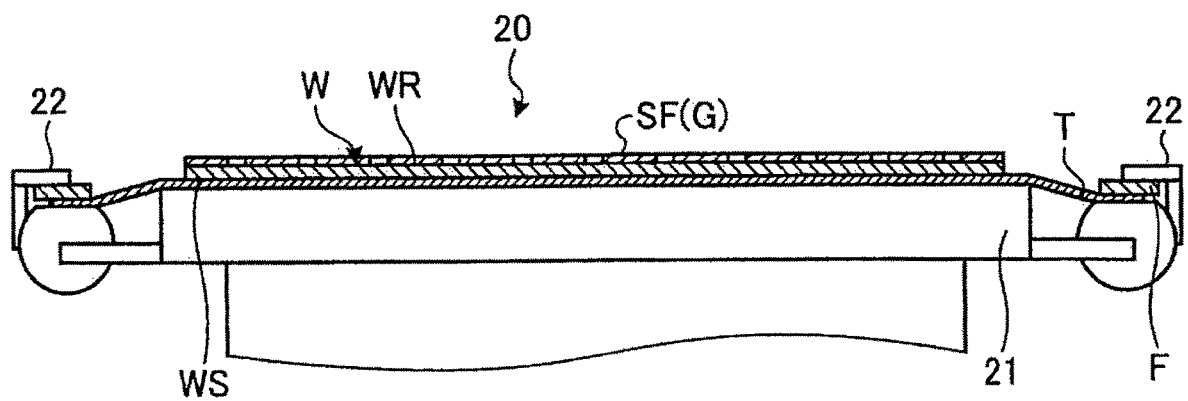
FIG. 8 is a sectional view of the wafer processed by the shield film removing step depicted in FIG. 7.

While the wavelength of the laser beam LB to be applied from the laser beam applying means 23 is 355 nm in the first preferred embodiment, the wavelength of the laser beam LB is not limited to 355 nm, provided that the shield film SF can be removed by ablation using the laser beam LB. FIG. 8 depicts a condition obtained by finishing the shield film removing step ST3. As depicted in FIG. 8, the back side WR of the wafer W is exposed in the area corresponding to each division line L. In other words, the back side WR of the wafer W is covered with the shield film SF in the other area corresponding to each device D. In the case that the division lines L cannot be detected from the back side WR of the wafer W even by the use of an infrared camera, the chuck table 21 may be formed of a transparent material such as glass, wherein the front side WS of the wafer W may be imaged from the under side of the chuck table 21 to detect the division lines L.

Figure 9:
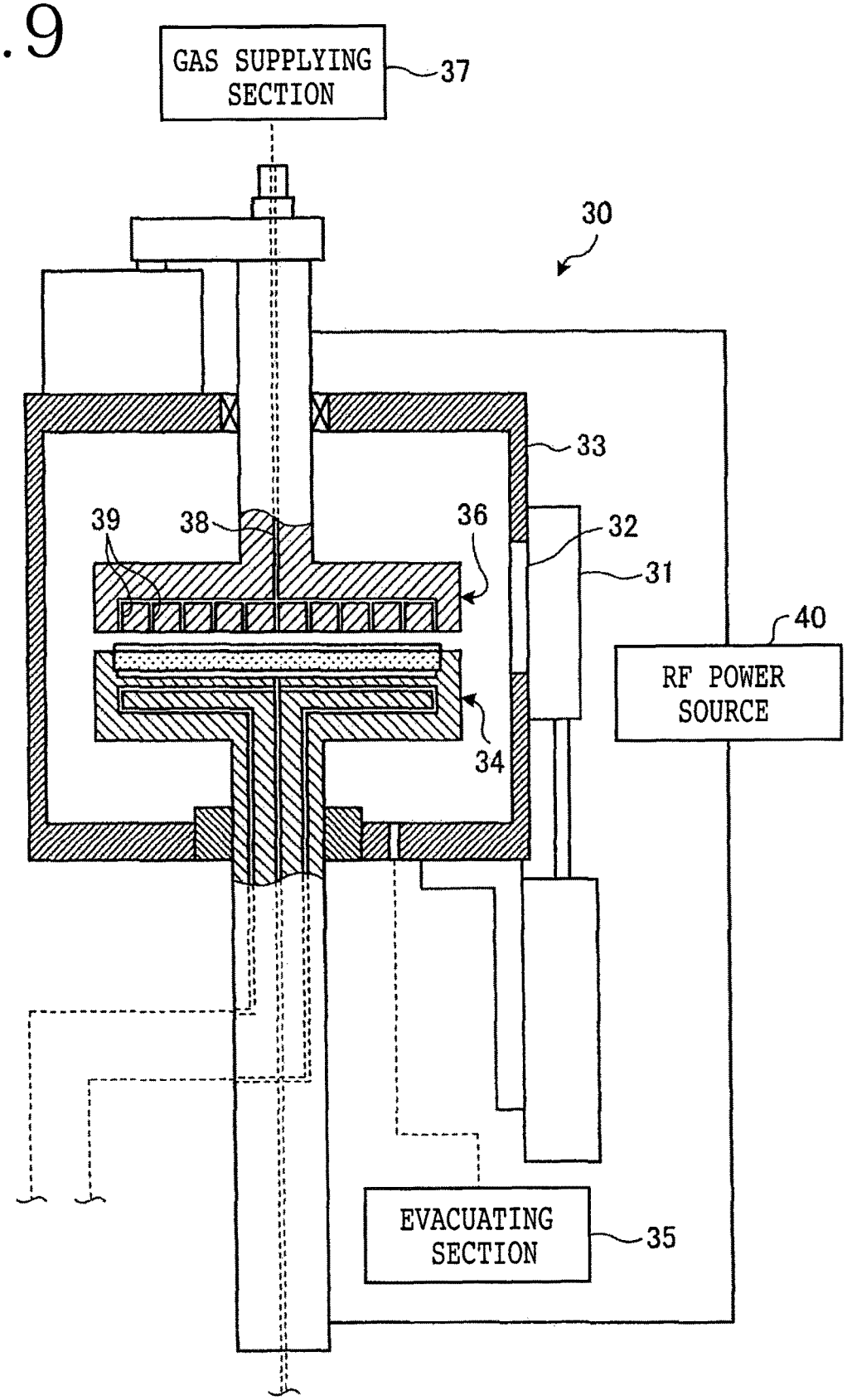
FIG. 9 is a sectional view depicting an etching apparatus for performing a dividing step depicted in FIG. 3.

The dividing step ST4 is a step of plasma-etching the wafer W from the back side WR thereof after performing the shield film removing step ST3, thereby partially removing the wafer W (substrate S) in the area corresponding to each division line L to thereby divide the wafer W into the individual device chips DT. FIG. 9 depicts the dividing step ST4 using the plasma etching in the first preferred embodiment. As depicted in FIG. 9, the plasma etching is performed by using a plasma etching apparatus 30 in the following manner. First, a shutter 31 is lowered to open an opening 32 formed through a side portion of a chamber 33. In the condition, the wafer W is loaded from the opening 32 into the chamber 33. The wafer W loaded into the chamber 33 is electrostatically held on a chuck table 34 in the condition where the back side WR of the wafer W is exposed upward. Thereafter, the shutter 31 is raised to close the opening 32, and the inside space of the chamber 33 is evacuated by operating an evacuating section 35.

Figure 10:
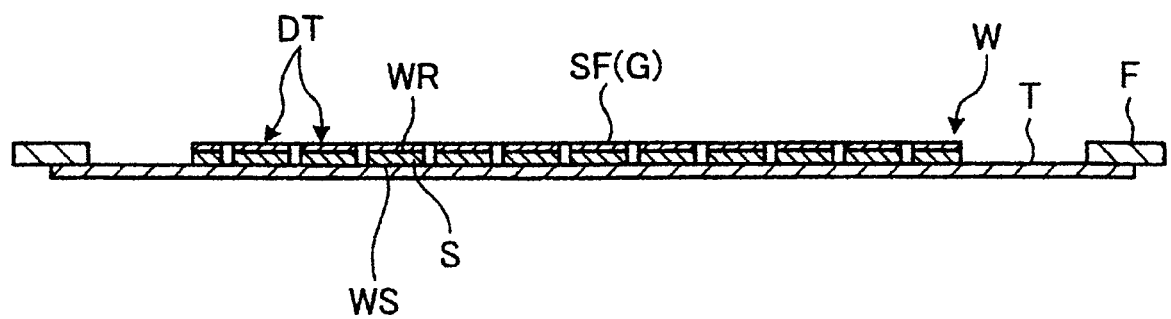
FIG. 10 is a sectional view of the wafer processed by the dividing step using the etching apparatus depicted in FIG. 9.

Thereafter, etching gas supplying means 36 is lowered and a fluorine-based stable gas as an etching gas is supplied from a gas supplying section 37 to a gas flow passage 38. The etching gas supplied is then discharged from a plurality of gas discharge holes 39 communicating with the gas flow passage 38 and opening to the lower surface of the etching gas supplying means 36. Further, an RF voltage is applied from an RF power source 40 to a space defined between the etching gas supplying means 36 and the chuck table 34. As a result, the etching gas discharged from the gas discharge holes 39 is dissociated to form a plasma. Ions in the plasma are attracted to the back side WR of the wafer W in the exposed area corresponding to each division line L. As a result, the exposed area of the back side WR where it is not covered with the shield film SF is etched by the etching effect of the plasma. In this preferred embodiment, the substrate S of the wafer W is fully etched in an amount corresponding to the thickness thereof from the back side WR to the front side WS of the wafer W as depicted in FIG. 10. That is, the substrate S of the wafer W is fully cut by a plurality of etched grooves corresponding to all the division lines L, so that the wafer W is divided along all the division lines L at a time to obtain the individual device chips DT.

Examples of the fluorine-based stable gas to be used as the etching gas in the dividing step ST4 include $SF_6$, $CF_4$, $C_2F_6$, $C_2F_4$, and $CHF_3$. At least one of these gases is used. The etching rate for the shield film SF is less than or equal to 1/10 of the etching rate for the substrate S of the wafer W. Accordingly, the thickness of the shield film SF is set so that the shield film SF is left even after fully etching the substrate S in the thickness direction thereof. Thusly, in the dividing method according to the first preferred embodiment, the shield film SF is used as a mask for protecting the devices D from the plasma.

The dividing method according to the first preferred embodiment can exhibit the following effects. The shield film SF as the die bonding adhesive G for bonding each device chip DT to a mother substrate or another chip is used as a mask for plasma etching. Accordingly, it is unnecessary to provide any mask dedicated to plasma etching on the back side WR of the wafer W. Further, it is also unnecessary to remove such dedicated mask. As a result, the steps of the dividing method can be made efficient. Further, the liquid resin LR for forming the shield film SF contains the laser absorbing agent for absorbing the laser beam LB. Accordingly, in the shield film removing step ST3, the shield film SF can be removed efficiently and reliably in the area corresponding to each division line L. As a result, the mask for protecting the devices D from the plasma can be formed efficiently at low cost.

As described above, the dividing method according to the first preferred embodiment includes the dividing step ST4 by plasma etching using a fluorine-based stable gas as an etching gas, wherein the shield film SF as the die bonding adhesive G having plasma resistance is used as a low-cost mask. To this end, the shield film SF contains a laser absorbing agent, so that the shield film SF can be easily removed in the area corresponding to each division line L by ablation using the laser beam LB.

Second Preferred Embodiment

Figure 11:
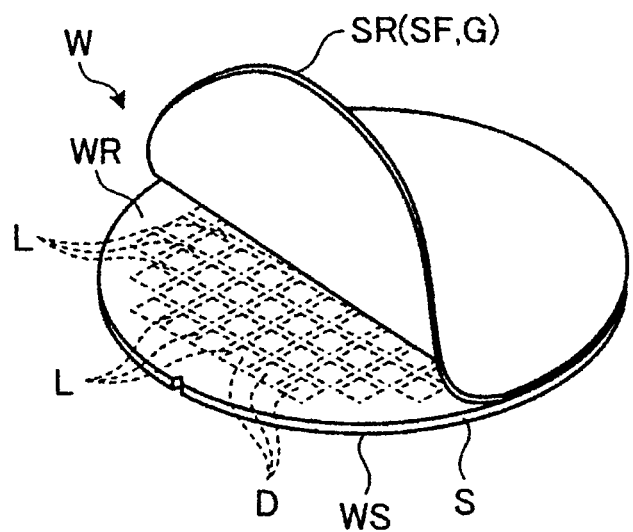
FIG. 11 is a perspective view depicting a shield film forming step in a wafer dividing method according to a second preferred embodiment.

A wafer dividing method according to a second preferred embodiment will now be described with reference to the drawings. FIG. 11 is a perspective view depicting a shield film forming step in the second preferred embodiment. In FIG. 11, the same parts as those depicted in the first preferred embodiment are denoted by the same reference symbols, and the description thereof will be omitted.

The wafer dividing method (which will be hereinafter referred to simply as "dividing method") according to the second preferred embodiment is the same as the dividing method according to the first preferred embodiment except that the shield film forming step ST2 is different. That is, as depicted in FIG. 11, the shield film forming step ST2 in the second preferred embodiment is a step of applying a sheet resin SR to the back side WR of the wafer W, thereby forming a shield film SF from the sheet resin SR, the sheet resin SR containing the laser absorbing agent mentioned above.

The sheet resin SR to be used in the second preferred embodiment is a die attach film (DAF) as the die bonding adhesive G. The DAF includes a base sheet and a paste layer formed on the base sheet. The base sheet is formed of epoxy resin, acrylic resin, synthetic rubber, or polyimide, for example. The paste layer is formed of acrylic adhesive or rubber adhesive. More specifically, the sheet resin SR is attached to the back side WR of the wafer W in the shield film forming step ST2 in the second preferred embodiment, thereby forming the shield film SF. Further, the laser absorbing agent mixed with the sheet resin SR is the same as that used in the first preferred embodiment.

In the dividing method according to the second preferred embodiment, the shield film SF as the die bonding adhesive G for bonding each device chip DT to a mother substrate or another chip is used as a mask for plasma etching. Further, the sheet resin SR for forming the shield film SF contains the laser absorbing agent for absorbing the laser beam LB. Accordingly, the mask for protecting the devices D from the plasma can be formed efficiently at low cost as in the first preferred embodiment.

Third Preferred Embodiment

Figure 12:
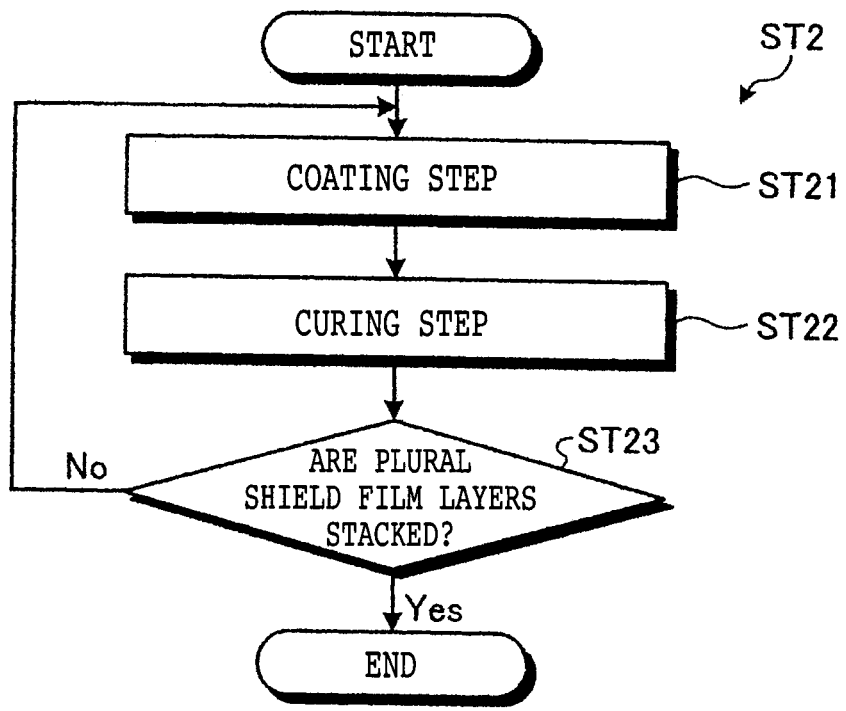
FIG. 12 is a flowchart depicting the flow of a shield film forming step in a wafer dividing method according to a third preferred embodiment.
Figure 13:
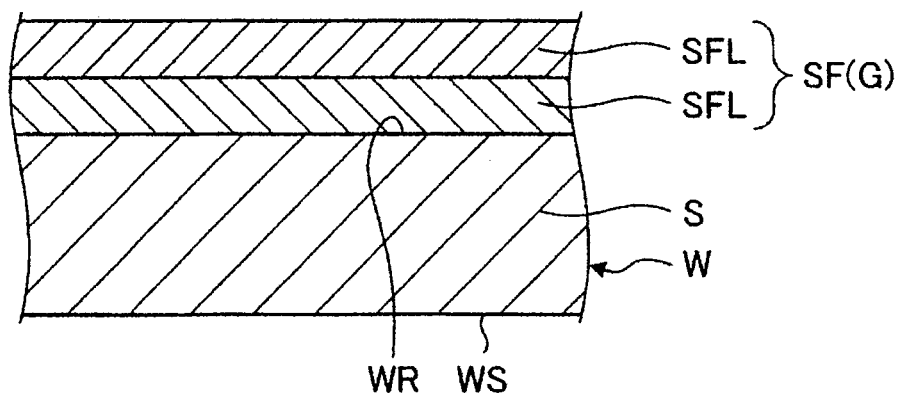
FIG. 13 is an enlarged sectional view of an essential part of the wafer processed by the shield film forming step depicted in FIG. 12.

A wafer dividing method according to a third preferred embodiment will now be described with reference to the drawings. FIG. 12 is a flowchart depicting the flow of a shield film forming step in the third preferred embodiment. FIG. 13 is an enlarged sectional view of an essential part of the wafer W in the condition where the shield film forming step in the third preferred embodiment is finished. In FIGS. 12 and 13, the same parts as those depicted in the first preferred embodiment are denoted by the same reference symbols, and the description thereof will be omitted.

The wafer dividing method (which will be hereinafter referred to simply as "dividing method") according to the third preferred embodiment is the same as the dividing method according to the first preferred embodiment except that the shield film forming step ST2 is different. That is, as depicted in FIG. 12, the shield film forming step ST2 in the third preferred embodiment includes a coating step ST21 of applying the liquid resin LR to the back side WR of the wafer W by using an apparatus similar to the coating apparatus 10 depicted in FIG. 6 and a curing step ST22 of curing the liquid resin LR applied with the elapse of time, wherein the coating step ST21 and the curing step ST22 are repeated until a plurality of shield film layers SFL formed from the liquid resin LR cured above are stacked on the back side WR of the wafer W (step ST23: Yes). By finishing the shield film forming step ST2 in the third preferred embodiment, the plural shield film layers SFL are stacked on the back side WR of the wafer W. That is, the shield film SF including the stacked shield film layers SFL is formed on the back side WR of the wafer W as depicted in FIG. 13. While two shield film layers SFL are stacked in the third preferred embodiment depicted in FIG. 13, three or more shield film layers SFL may be stacked.

In the dividing method according to the third preferred embodiment, the shield film SF as the die bonding adhesive G for bonding each device chip DT to a mother substrate or another chip is used as a mask for plasma etching. Further, the liquid resin LR for forming the shield film SF contains the laser absorbing agent for absorbing the laser beam LB. Accordingly, the mask for protecting the devices D from the plasma can be formed efficiently at low cost as in the first preferred embodiment.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer dividing method for dividing a wafer having a plurality of devices on a front side, said devices being formed in a plurality of separate regions defined by a plurality of crossing division lines, said wafer dividing method comprising:
   a shield film forming step of applying a liquid resin or a sheet resin to a back side of said wafer, thereby forming a shield film from said liquid resin or said sheet resin, said liquid resin or said sheet resin containing a laser absorbing agent for absorbing a laser beam;
   a shield film removing step of applying said laser beam along each division line to said shield film formed on the back side of said wafer, thereby performing ablation to remove said shield film along each division line; and
   a dividing step of said wafer after performing said shield film removing step by plasma-etching said wafer from the back side thereof in an area corresponding to each division line to thereby divide said wafer into a plurality of individual device chips;
   said shield film being formed as a die bonding adhesive, wherein said shield film forming step includes a coating step of applying said liquid resin to the back side of said wafer and a curing step of curing said liquid resin applied;
   said coating step and said curing step being repeated until a plurality of shield film layers formed from said liquid resin cured are stacked on the back side of said wafer, thereby forming said shield film including said plurality of shield film layers stacked.

2. The wafer dividing method according to claim 1, wherein said laser absorbing agent is selected from the group consisting of a dye, coloring matter, and ultraviolet absorbing agent.

3. The wafer dividing method according to claim 1, wherein said laser absorbing agent is selected from the group consisting of a fine powder of oxide and a fine power of nitride.

* * * * *